United States Patent [19]

Clement et al.

[11] Patent Number: 5,036,205
[45] Date of Patent: Jul. 30, 1991

[54] APPARATUS FOR THE TRANSFER AND IN-SITU REACTIONS UNDER A CONTROLLED ATMOSPHERE, OF SPECIMENS FOR TRANSMISSIVE ELECTRON MICROSCOPY

[75] Inventors: José Clement, Chambrey; Daniel Guerard, Malzeville, both of France

[73] Assignee: Chaixmeca Sarl, Maxeville, France

[21] Appl. No.: 437,804

[22] Filed: Nov. 17, 1989

[30] Foreign Application Priority Data

Nov. 18, 1988 [FR] France .................. 88 15221

[51] Int. Cl.$^5$ ............................................. G21K 5/10
[52] U.S. Cl. ............................. 250/442.1; 250/440.1
[58] Field of Search ............... 250/440.1, 441.1, 442.1

[56] References Cited

U.S. PATENT DOCUMENTS

| | | | |
|---|---|---|---|
| 2,220,973 | 11/1940 | Marton | 250/441.1 |
| 3,858,049 | 12/1974 | Koch et al. | 250/442.1 |
| 3,896,314 | 7/1975 | Nukui et al. | 250/442.1 |
| 4,101,778 | 7/1978 | Von Rauch | 250/442.1 |

FOREIGN PATENT DOCUMENTS

| | | | |
|---|---|---|---|
| 2511449 | 9/1976 | Fed. Rep. of Germany . | |
| 53-43468 | 4/1978 | Japan . | |
| 1295054 | 11/1972 | United Kingdom | 250/441.1 |

Primary Examiner—Bruce C. Anderson
Attorney, Agent, or Firm—Young & Thompson

[57] ABSTRACT

The present invention concerns a device for the transfer and in-situ reactions under a controlled atmosphere, of specimens for transmissive electron microscopy, characterized in that it is additionally provided with a means (7) for guiding and locking in transport and analysis positions of the rod (1) provided with the grid holders (2), the said rod (1) being advantageously integrated by screwing with the corresponding end of the traction bar (5) which is guided in the cover (3), of which the opening (9) of the front part (3') of lesser diameter is extended over a portion of the length of this front part (3'), on both sides, by longitudinal grooves (10), the said front part (3') being connected to the rest of the cover (3) by screwing of a shouldered portion (11), a gasket (13') effecting the sealing at the level of the screwed assembly.

6 Claims, 2 Drawing Sheets

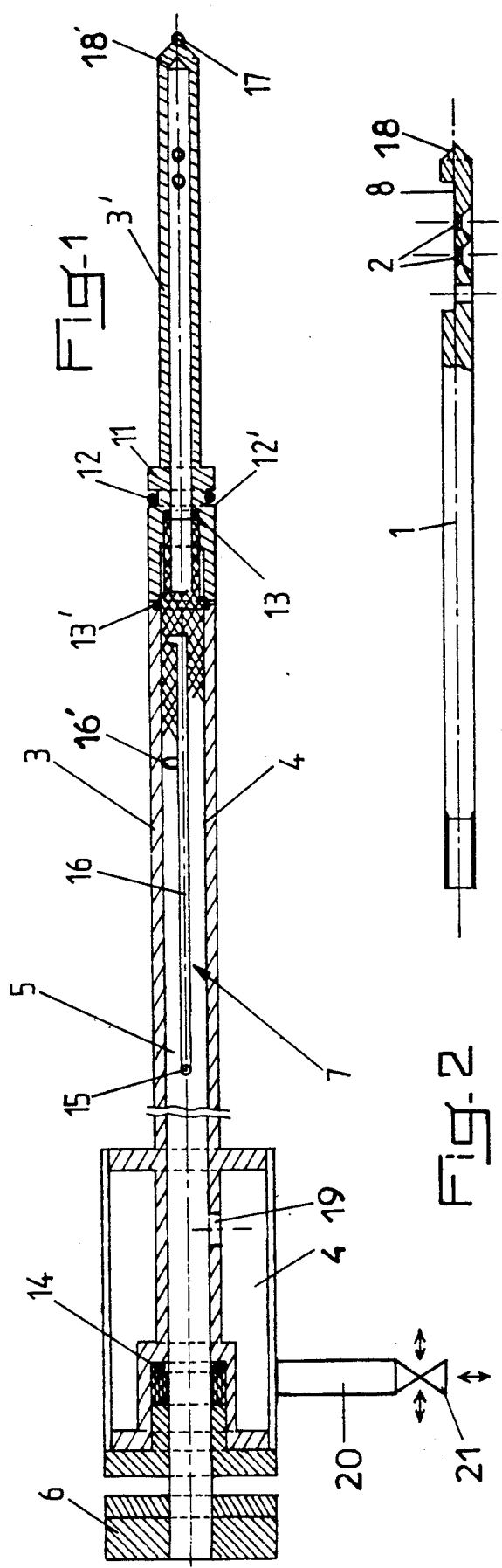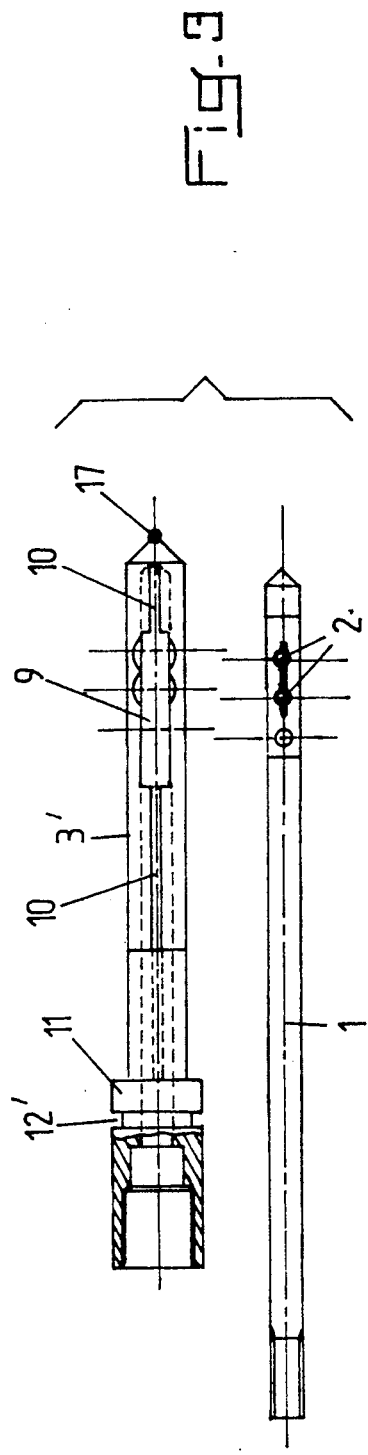

F I G. 1A
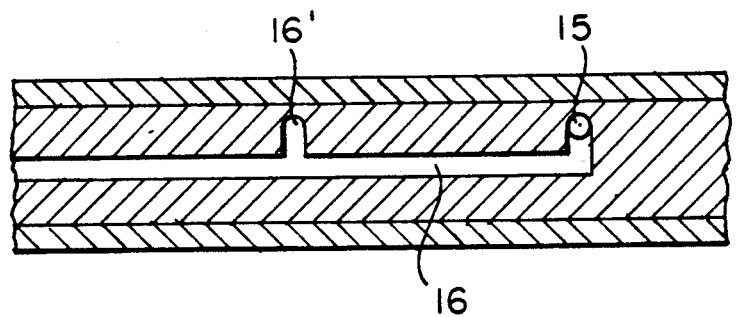

APPARATUS FOR THE TRANSFER AND IN-SITU REACTIONS UNDER A CONTROLLED ATMOSPHERE, OR SPECIMENS FOR TRANSMISSIVE ELECTRON MICROSCOPY

The present invention concerns the field of transmissive electron microscopy, particularly under a controlled atmosphere, of samples, especially graphite insertion compounds and has as an object a device for the transfer and insitu reactions under a controlled atmosphere of samples intended for such study. This apparatus may also be used, either internally even of the microscope chamber, or in the gate of this latter, for conducting chemical reactions between the sample or samples mounted on the grid or grids and gases of controlled temperature, pressure, composition and nature, which is particularly useful for performing a kinematic study of these reactions.

Insertion compounds of graphite have been the subject of intense study for a number of years, notably because, on the one hand, of their electrical conductivity parallel to the graphite layers, which is very high at ambient temperature and for certain compounds close to that of cooper, together with a strong anisotropy which may be as high as $10^6$, and on the other hand, of the superconductive character of certain compounds which can attain the temperature of liquid helium and, finally, of the great variety of species which may be inserted between the graphite layers, namely from alkaline metals to halogens including metallic alloys, alkaline hydrides, the alkaline-earth metals, certain lanthanides, acids, halides or oxyhalides of transition metals, etc...

The class of insertion compounds of graphite comprises at present 300 to 400 different phases taking account of the stage phenomenon. Thus, a compound is said to be stage 1, 2, 3... according as two successive inserted layers are separated by 1, 2, 3... layers of graphite. In certain cases, the stage may attain the value of 12 or 13.

The great variety of reagents confers to the insertion compounds various properties amply justifying the intense study that has been devoted thereto.

The insertion compounds frequently have phase transitions which are revealed by variations of electrical resistivity or thermal dilation. In a great number of compounds, there exists in addition an incommensurability between the host lattice and inserted lattice and the reflections obtained are sometimes of very weak intensity when examined with x-rays.

It is therefore especially interesting to be able to study these compounds by any possible methods of investigation, and more particularly by transmissive electron microscopy.

Such methods of investigation are nevertheless difficult to practice, because the insertion compounds are for the most part very fragile in air, such that there arise problems in transferring the samples to the chamber of an electron microscope.

Specifically, emphasis has been placed on insertion compounds of graphite for which a transfer under a controlled atmosphere proves to be indispensable. The known sample holders may certainly be used for any types of materials whose geometric characteristics, especially thickness, are compatible with the observation by transmission in an electron microscope. In addition, they allow positioning of the samples, even those not fragile in air, such that they are caused to penetrate into the reaction chamber of the sample holder after a first examination with the electron microscope, to cause them thereafter to react and to analyze them without having to use other equipment and, above all, without them being returned into contact with the air.

Thus, there does not exist at present sample holders adaptable to any type of side-inlet electron microcope, which permits both a transfer of samples under a controlled atmosphere and in-situ reactions. This latter concept is very important, because it permits performing chemical reactions when the sample holder is at the very interior of the microscope chamber and the grid holder rod is in the so-called transport position.

There thus arises the problem of introducing a microscope grid, first prepared in a sterile chamber under controlled atmosphere, into the examining chamber of an electron microscope, without it coming into contact with the air. To this end, a rod enclosing the sample holders, which may be of variable diameter and provided with a projection serving to maneuver its opening through the vacuum pumps, then through the door to the gate of the microscope, must penetrate into the said gate to a length of about 20 cm.

Protection of the sample by an exterior sleeve and kinematic studies could be effected by equipment mounted on a clamp for connection with the gate of the microscope, leading to a modification of this latter.

Such modification, aside from being inconvenient, requires a lengthening of the sample holders which is incompatible with the size of most sterile chamber gates.

It would also be possible to construct a sterile chamber mounted directly on the outlet of the gate of the microscope provided this latter is suitably modified. Such an embodiment is nevertheless rather complicated.

On the other hand, a transfer device is known of which the forward part is provided with an exterior gasket which is received at the interior of the microscope chamber. This device nevertheless has a number of disadvantages, namely, on the one hand, a risk of deterioration of the gasket when sliding the movable portion of the sample holder between the guide rails of the object holder, on the other hand, a lack of control of the precise positioning of the object interiorly of the chamber because the guiding of the movement in this latter is effected through the intermediary of an elastic gasket and, finally, the provision of a single grid housing on the stage, which leads to relatively long operations of loading the grid for each sample.

The present invention has as an object to overcome these disadvantages. Specifically, it has as an object a device for the transfer and in-situ reactions under a controlled atmosphere of samples for transmissive electrode microscopy, essentially constituted by a cylindrical rod of slight diameter comprising, near one end, two grid holders and slidably mounted in a cover of greater diameter provided with a sealed chamber for housing the grid holders in transport position, by a traction bar integrated with the end of the rod of slight diameter opposite the grid holders, guided in the cover of greater diameter and provided at its other end with a manipulating button, the grid holders being advantageously provided in a flat of the end of the rod and the cover being advantageously formed in two parts and having a front part of lesser diameter intended to penetrate into the gate of the microscope and provided with a longitudinal opening corresponding at least to the section of the grid holders of the rod in analysis position of this latter, characterized in that it is provided in addition with a means for guiding and locking in transport and analysis positions the rod provided with the grid holders, the said rod being advantageously integrated by screwing with the corresponding end of the traction bar which is guided in the cover, of which the opening of the front part of lesser diameter is extended over a portion of the length of this front part, on both sides, by longitudinal grooves, the said front part being connected to the rest of the cover by screwing of a shouldered portion, a gasket effecting the sealing at the level of the screwed assembly.

The invention will be better understood thanks to the following description, which refers to a preferred embodiment, given by way of non-limiting example, and explained with reference to the accompanying schematic drawing, in which:

FIG. 1 is a plan view, partically in section, of the device according to the invention;

FIG. 1A is an enlarged fragment of FIG. 1, with the parts in another operative position;

FIG. 2 is a view in side elevation, in section and on a larger scale, of the rod provided with the grid holders, and FIG. 3 is a plan view, on a larger scale, of the rod according to FIG. 2 and the end of the cover receiving this latter and penetrating into the gate of the microscope.

According to the invention, and as is shown more particularly by way of example in FIG. 1 of the accompanying drawings, the apparatus for the transfer and in-situ reactions under a controlled atmosphere, of specimens for transmissive electron microscopy, which is essentially constituted by a cylindrical rod 1 of slight diameter comprising near one end, two grid-holders 2 and mounted slidably in a cover 3 of greater diameter provided with a sealed chamber 4 for housing the gridholders 2 in transport position, by a traction bar 5 integrated with the end of the rod 1 of slight diameter opposite the grid-holders 2, guided in the cover 3 of greater diameter and provided at its other end with a manipulating button 6, the grid-holders 2 being advantageously arranged in a flat 8 of the end of the rod 1 and the cover 3 being advantageously formed in two parts and having a front part 3' of lesser diameter intended to penetrate into the gate of the microscope and provided with a longitudinal opening 9 corresponding at least to the section of the grid holders of the rod 1 in analysis position of this latter, is characterized in that it is provided, in addition, with a means 7 for guiding and locking in transport and analysis positions the rod 1 provided with grid holders 2, the said rod 1 being advantageously integrated by screwing with the corresponding end of the traction bar 5 which is guided in the cover 3, of which the opening 9 of the front part 3' of lesser diameter is extended, over a portion of the length of this front part 3', on both sides, by longitudinal grooves 10, the said front part 3' being connected to the rest of the cover 3 by screwing of a shouldered portion 11, a gasket 13' effecting the sealing at the level of the screwed assembly (FIGS. 1 and 3).

The provision of the longitudinal grooves 10 permits a progressive placing under vacuum of the samples mounted on the grid holders 2 at the time of the sliding to analysis position of the rod 1 in the gate of the microscope.

According to a characteristic of the invention, the rear part of the cover 3, near the manipulating button 6, is advantageously surrounded by a sleeve 22 delimiting a sealed chamber connected to the chamber 4 through the intermediary of a hole 19 provided in the said rear part of the cover 3, the said chamber being itself connected, through the intermediary of a tube 20, to a multi-position valve 21.

The cover 3 is additionally provided, on the one hand, near its shouldered portion 11, with an external sealing gasket 12 housed in a channel 12' and intended to cooperate with the opening for passage of the gate of the microscope and, on the other hand, with an internal gasket 13 delimiting, with a gasket 14 provided at the opposite end of the cover 3, for sealing and guidance of the opposite end of the bar 5, the gasket 13' and the multi-position valve 21, situated at the end of the tube 20, perpendicular to the sleeve 22, the sealed chamber 4 (FIG. 1).

The traction bar 5 is provided with the means 7 for guiding and locking in positions of transport, reaction and analysis of the rod 1, which is constituted by a guiding projection 15 cooperating with a longitudinal guiding groove 16 provided in the cover 3, this groove 16 having a right angled porotion at its ends and an intermediate portion 16' and permitting locking of the projection 15 in the position of analysis, transport and reaction of the rod 1. The intermediate portion 16' permits stopping the bar 5 in a position where it is possible to effect an evacuation of the chamber 4 through the intermediary of the gate of the microscope.

The sample positioned on the grid holders 2 of the rod 1 under a controlled atmosphere in the sterile gas circulation chamber is then protected from the exterior atmosphere by retraction of the rod 1 interiorly of the sealed chamber 4 of the cover 3 by means of the traction bar 5. The apparatus is thus in a closed position permitting transport of a sample on the grids.

Thanks to the multi-position valve 21, it is possible to effect, as a first step, evacuation of the sealed chamber 4 and replacement of the initial atmosphere by another atmosphere, whose nature, composition, pressure and temperature may be controlled so as to effect a reaction of this atmosphere with the sample. Such an operation may be repeated several times, so as to establish, for example, kinetics of the reaction. It is possible to cause reactive gas to circulate in the chamber 4 by maintaining the cover 3 in "pumping in the gate" position. If the reactive atmosphere is capable of attacking the gate or the pumping assembly of the microscope, it is necessary, at the end of the operation, to evacuate the chamber 4 through the intermediary of the valve 21.

Locking in closed or reaction position is assured by a slight rotation of the rod 1 and thus of the bar 5 by means of the manipulating button 6, for example by 10°, bringing the projection 15 to the base of the right angle part of the corresponding end of the groove 16, as shown in FIG. 1A or of the intermediary portion 16'.

According to another characteristic of the invention, the front part 3' of the cover 3 is provided, at its free end, with a ruby intended to cooperate with a conical female guiding part provided in the examination chamber of the microscope. Thus, the end of the of the cover 3 may be perfectly positioned in the said chamber of the microscope, in the analysis positions of the grid holders 2.

According to a variant of the invention, the ruby 17 may be fixedly mounted on the conical female guiding part provided in the examination chamber of the microscope, only the rod 1 being manipulated and its centering being assured, on the one hand, by the exterior cone of the front part of the cover 3 and, on the other hand, by the cone 18 of the free end of the rod 1 cooperating with the corresponding exterior cone 18' of the cover. Thus, it is possible to effect a perfect repositioning of the sample after reaction and examination of the evolution of a given particle after variable exposure times to a reactive gas.

In the case where a reaction study is not contemplated, the apparatus may thus be introduced by the front part of the cover 3 into the stage of the microscope, effecting the sealing by means of the external gasket 12. After attaining the usual degree of vacuum in the stage, the rod 1 is partially slid interiorly of the cover 3, outside of the sealed chamber 4, so as to obtain the same degree of vacuum at the level of the grid holders 2. Such an opening is effected in an intermediate position of the projection 15 in the groove 16. Thereafter, the grid holders 2 with the sample or samples are conducted into the analysis position of the rod 1 with locking in this position by slight rotation of the right angle part of the corresponding end of the groove 16, the interior door of the gate of the microscope is opened, and the assembly is lowered into the examination chamber of the microscope.

Thanks to the invention, it is possible to maintain a correct vacuum, not only dynamic in the body of the microscope, but also static in the gate, permitting obtaining good working conditions.

In addition, the apparatus according to the invention does not require any modification of the electron microscope itself or of the exterior dimensions of the sample holder. Finally, the sealing of the chamber housing the samples during transport and reaction being assured by internal gaskets of the apparatus, not coming in contact with the elements of the microscope, degradation of these gaskets is prevented and guiding of the apparatus interiorly of the examination chamber of the microscope may be effected without hindrance, and thus in a more precise manner.

Finally, the invention permits obtaining an apparatus for transfer and in-situ reactions under a controlled atmosphere of specimens for examination by a transmissive electron microscope having a lateral inlet permitting, on the one hand, to maintain the said samples under a controlled atmosphere outside of the periods of examination in the microscope and, on the other hand, to effect in-situ reactions between a sample and a gas whose nature, composition, pressure and temperature may be controlled, the said apparatus being adaptable to all types of electron microscopes having lateral inlet without requiring any modification of the microscope or its inlets.

It will be understood that the invention is not limited to the embodiment described and shown in the accompanying drawing. Modifications remain possible, especially from the point of view of the constitution of the various elements or by substitution of equivalent techniques, without departing whatsoever from the scope of protection of the invention.

We claim:

1. Device for the transfer and in-situ reactions under a controlled atmosphere, of specimens for transmissive electron microscopy, essentially constituted by a cylindrical rod (1) of slight diameter comprising, near one end, two grid holders (2) and slidably mounted in a cover (3) of greater diameter provided with a sealed chamber (4) for housing the grid holders (2) in transport position, by a traction bar (5) integrated with the end of the rod (1) of slight diameter opposite the grid holders (2), guided in the cover (3) of greater diameter and provided at its other end with a manipulating button (6), the grid holders (2) being advantageously arranged in a flat (8) of the end of the end of the rod (1) and the cover (3) being advantagiously formed in two parts and having a front part (3') of lesser diameter intended to penetrate into the gate of the microcope and provided with a longitudinal opening (9) corresponding at least to the section of the grid holders of the rod (1) in analysis position of this latter, characterized in that it is additionally provided with a means (7) for guiding and locking in transport and analysis positions of the rod (1) provided with the grid holders (2), the said rod (1) being advantageously integrated by screwing with the corresponding end of the traction bar (5) which is guided in the cover (3), of which the opening (9) of the front part (3') of lesser diameter is extended over a portion of the length of this front part (3'), on both sides, by longitudinal grooves (10), the said front part (3') being connected to the rest of the cover (3) by screwing of a shouldered portion (11), a gasket (13') effecting sealing at the level of the screwed assembly.

2. Apparatus according to claim 1, characterized in that the rear part of the cover (3) near the manipulating button (6), is advantageously surrounded by a sleeve (22) delimiting a sealed chamber connected to the chamber (4) through the intermediary of a hole (19) provided in the said rear part of the cover (3), the said chamber being itself connected, through the intermediary of a tube (20), to a multi-position valve (21).

3. Device according to claim 2, characterized in that the cover (3) is additionally provided, on the one hand, near its shouldered portion (11), with an external sealing gasket (12) received in a channel (12') and intended to cooperate with the opening for passage of the gate of the microscope and, on the other hand, with an internal gasket (13) delimiting, with a gasket (14) provided at the opposite end of the cover (3), for sealing and guiding the opposite end of the bar (5), the gasket (13') and the multi-position valve (21), situated at the end of the tube (20), perpendicular to the sleeve (22), the sealed chamber (4).

4. Apparatus according to claim 1, characterized in that the traction bar (5) is provided with the means (7) for guiding and locking in transport, reaction and analysis positions of the rod (1), which is constituted by guiding projection (15) cooperating with a longitudinal guiding groove (16) provided in the cover (3), this groove (16) having a right angle portion at its ends and an intermediate portion (16') and permitting locking of the projection (15) in the analysis, transport and reaction positions of the rod (1).

5. Apparatus according to claim 1, characterized in that the front part (3') of the cover (3) is provided, at its free end, with a ruby (17) intended to cooperate with a conical female guiding part provided in the examination chamber of a microscope.

6. Apparatus according to claim 5, characterized in that the ruby (17) is mounted integrally with the conical female guiding portion provided in the examination chamber of the microscope, only the rod (1) being manipulated and its centering being assured, on the one hand, by the exterior cone of the front part of the cover (3), and on the other hand, by the cone (18) of its free end cooperating with the interior cone (18') corresponding to the cover (3).

* * * * *